(12) United States Patent
Liu

(10) Patent No.: US 10,416,252 B2
(45) Date of Patent: Sep. 17, 2019

(54) MR RECEIVE COIL WITH DETUNE CIRCUIT AND ENERGY HARVESTING CIRCUIT

(71) Applicant: KONINKLIJKE PHILIPS N.V., Eindhoven (NL)

(72) Inventor: Yong Liu, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 150 days.

(21) Appl. No.: 15/320,767

(22) PCT Filed: Jun. 30, 2015

(86) PCT No.: PCT/EP2015/064768
§ 371 (c)(1),
(2) Date: Dec. 21, 2016

(87) PCT Pub. No.: WO2016/001180
PCT Pub. Date: Jan. 7, 2016

(65) Prior Publication Data
US 2017/0160356 A1 Jun. 8, 2017

(30) Foreign Application Priority Data

Jul. 1, 2014 (WO) ................ PCT/CN2014/081341
Nov. 5, 2014 (EP) .................................... 14191920

(51) Int. Cl.
*G01R 33/36* (2006.01)
*H02J 50/10* (2016.01)
(Continued)

(52) U.S. Cl.
CPC .......... *G01R 33/3692* (2013.01); *A61B 5/055* (2013.01); *G01R 33/20* (2013.01);
(Continued)

(58) Field of Classification Search
CPC ............ G01R 33/3692; G01R 33/3628; G01R 33/3657; H02J 50/10; H02J 7/025; A61B 5/055
See application file for complete search history.

(56) References Cited

U.S. PATENT DOCUMENTS 7,514,924 B2   4/2009   Luedeke et al.
7,750,630 B2   7/2010   Van Helvoort et al.
(Continued)

OTHER PUBLICATIONS

Riffe et al "Power Scavenging Circuit for Wireless DC Power" Proceedings of the International Society for Magnetic Resonance in Med. May 5, 2007 p. 3273.

*Primary Examiner* — Gregory H Curran

(57) ABSTRACT

A magnetic resonant device includes a receiving antenna, a detune circuit, and an energy harvesting circuit. The detune circuit is coupled to the receiving antenna for switching the receiving antenna between a resonant mode and a non-resonant mode. The receiving antenna in the resonant mode receives a magnetic resonant signal of a magnetic resonant examination. The energy harvesting circuit is coupled to the detune circuit for inducing a harvesting current flowing through the receiving antenna in the non-resonant mode to harvest electric power from the receiving antenna. Advantageously, with this simple and low cost power scheme, traditional cumbersome and expensive DC cablings can be eliminated from the magnetic resonant device.

16 Claims, 4 Drawing Sheets

(51) Int. Cl.
*A61B 5/055* (2006.01)
*G01R 33/20* (2006.01)
*H02J 7/02* (2016.01)

(52) U.S. Cl.
CPC ..... *G01R 33/3628* (2013.01); *G01R 33/3657* (2013.01); *H02J 7/025* (2013.01); *H02J 50/10* (2016.02)

(56) References Cited

U.S. PATENT DOCUMENTS

| | | |
|---|---|---|
| 8,085,048 B2 | 12/2011 | Biber et al. |
| 2003/0206019 A1 | 11/2003 | Boskamp |
| 2011/0001927 A1 | 1/2011 | Kasper |
| 2011/0115303 A1* | 5/2011 | Baarman ................. H02J 17/00 307/104 |
| 2012/0313645 A1 | 12/2012 | Biber |
| 2014/0163355 A1* | 6/2014 | Kurpad ................. A61B 5/055 600/417 |
| 2014/0218035 A1 | 8/2014 | Okamoto |

* cited by examiner

MR RECEIVE COIL WITH DETUNE CIRCUIT AND ENERGY HARVESTING CIRCUIT

CROSS REFERENCE TO RELATED APPLICATIONS

This application is a U.S. national phase application of International Application No. PCT/EP2015/064768, filed on Jun. 30, 2015, which claims the benefit of CN application PCT/CN2014/081341 dated Jul. 1, 2014, and EP application 14191920.9 filed on Nov. 5, 2014, both of which are incorporated herein by reference.

FIELD OF THE INVENTION

The present invention relates to magnetic resonance devices, in particular to magnetic resonant devices with wireless RF coils.

BACKGROUND OF THE INVENTION

Magnetic resonant methods which utilize interaction between magnetic field and nuclear spins in order to form two-dimensional or three-dimensional images are widely used nowadays, notably in the field of medical diagnostics.

Usually, magnetic devices comprise a superconducting main magnet for the generation of static B0-field in an examination zone, gradient coils for the generation of switched magnetic field gradients during the imaging sequence, and a radio frequency (RF) coil assembly. The RF coil assembly of known magnetic resonant devices includes a transmit coil to generate B1-field for excitation of nuclear spins, and one or more receiving antennas used in conjunction with the transmit coil to detect and receive the magnetic resonant signals. Typically, the receiving antennas of the RF coil assembly are connected to a remote receiver system via a bundle of coaxial cables and wires with bazooka baluns. Additionally, the receiving antennas of the RF coil assembly are supplied power via a series of DC cables.

It is believed that the cabling between magnetic resonant receiving antennas and the remote receiver system can be replaced by wireless transmission of the received magnetic resonant signals. Furthermore, a rechargeable battery or a capacitor can be incorporated in magnetic resonant devices in place of the DC cables. In order to keep the battery/capacitor charged, the RF energy generated by the transmit coils can be picked up by a pick-up coil operating at the same resonant frequency as the magnetic resonant signals. The RF energy is further rectified to provide the necessary power for battery/capacitor charging. Such wireless power scheme will result in B1-field inhomogeneity due to pick-up coil interference. As a consequence of B1-field inhomogeneity, the image quality will degrade.

Another wireless power scheme is found in the journal article "Power scavenging circuit for wireless DC power" by M. J. Riffe et al., proceedings of the international society for magnetic resonance in medicine, ISMRM, 5 May 2007, page 3273. In this wireless power scheme, RF power that would normally be dissipated in a detuning network is captured by inductively coupling to the receiver coil's detuning circuit a power scavenging circuit. However, the receiver coil is facing the risk of improper detuning. US 2012/313645 A1 by Biber Stephan et al. provides an energy receiving antenna for inductively receiving energy from an temporally varying magnetic field. US 2014/218035 A1 by Okamoto Kazuya discloses a power transmitting unit wirelessly transmits electric power to an RF coil device by magnetically coupled resonant type wireless power transfer. However, these wireless power transfer means will increase system complexity and cost.

SUMMARY OF THE INVENTION

It is an object of the invention to provide a simple and low cost wireless power scheme for magnetic resonant devices without losing image quality.

Embodiments of the invention provide a magnetic resonant device and method thereof in the independent claims. Embodiments of the invention are given in the dependent claims. Embodiments of the invention harvest energy from a RF receiver during a transmit phase of a magnetic resonant device and power the RF receiver with the harvested energy throughout the magnetic resonant examination, such that traditional cumbersome and expensive DC cablings can be eliminated from the magnetic resonant device. By carefully selecting a harvesting current flowing through the RF receiver during the energy harvest, a balance can be achieved between system safety, image quality and energy harvest. That is, the harvesting current is set to be high enough to harvest adequate energy to power the RF receiver and at the same time to be low enough to keep the RF receiver in the non-resonant mode to avoid any damage to circuit components and bring negligible inference on image quality. Hereby, the energy harvesting circuit provides a simple and low cost power scheme for wireless magnetic resonant devices without degrading image quality.

Embodiments of the invention provide a magnetic resonant device. The magnetic resonant device comprises a receiving antenna, a detune circuit, and an energy harvesting circuit. The detune circuit is coupled to the receiving antenna for switching the receiving antenna between a resonant mode and a non-resonant mode. The receiving antenna in the resonant mode receives a magnetic resonant signal of a magnetic resonant examination. The energy harvesting circuit is coupled to the detune circuit for inducing a harvesting current flowing through the receiving antenna in the non-resonant mode to harvest electric energy from the receiving antenna. Advantageously, with this simple and low cost power scheme, traditional cumbersome and expensive DC cablings can be eliminated from the magnetic resonant device.

According to an embodiment of the present invention, a level of the harvesting current is determined by input impedance $Z_{in}$ of the energy harvesting circuit. Advantageously, the level of the harvesting current can be carefully selected according to the input impedance $Z_{in}$ of the energy harvesting circuit to achieve a balance between system safety, image quality and energy harvest.

According to an embodiment of the present invention, the energy harvesting circuit further comprises a rectifier with impedance $Z_{rec}$ and an impedance matching circuit for transferring the rectifier impedance $Z_{rec}$ to the input impedance $Z_{in}$. Advantageously, with the impedance matching circuit, an arbitrary rectifier impedance $Z_{rec}$ can be transformed to the input impedance $Z_{in}$ predetermined according to the desirable harvesting current, such that it is ensured that the balance between system safety, image quality and energy harvest can be achieved. Herby, system flexibility is improved.

According to one embodiment of the present invention, the impedance matching circuit comprises a transformer. Advantageously, by adjusting a turning ratio n between a primary winding and a secondary winding of the transformer, the induced harvesting current can be adjusted to achieve the balance.

According to one embodiment of the present invention, the impedance matching circuit comprises K stage transmission lines. Advantageously, by adjusting the stage K, the induced harvesting current can be adjusted to achieve the balance.

According to one embodiment of the present invention, the impedance matching circuit comprises a discrete component transformer network including an inductor and a capacitor.

According to one embodiment of the present invention, the energy harvesting circuit further comprises a rechargeable power source coupled to the energy harvesting circuit for being charged by the harvested electric energy. Advantageously, the harvested energy can be stored in the rechargeable power to provide stable DC power to the RF receiver.

According to one embodiment of the present invention, the receiving antenna includes a first capacitor, and the detune circuit is coupled in parallel with the first capacitor and the energy harvesting circuit is coupled in parallel with the detune circuit.

Embodiments of the invention provide an energy harvesting method. The method comprises the steps of switching a receiving antenna between a resonant mode and a non-resonant mode, receiving a magnetic resonant signal of a magnetic resonant examination by the receiving antenna in the resonant mode, inducing a harvesting current flowing through the receiving antenna in the non-resonant mode by an energy harvest circuit, and harvesting electric energy from the receiving antenna through which the harvesting current flows.

According to one embodiment of the present invention, the method further comprises selecting a level of the harvesting current to achieve an acceptable maximum level which ensures enough electric energy is harvested and at the same time keeps the receiving antenna in the non-resonant mode.

According to one embodiment of the present invention, the method further comprises rectifying the harvested electric energy by a rectifier having a rectifier impedance Zrec, and transferring the rectifier impedance Zrec to the input impedance Zin.

According to one embodiment of the present invention, the method further comprises charging a rechargeable power source with the harvested electric energy.

Embodiments of the invention provide a magnetic resonant device. The magnetic resonant device comprises a main magnet for generating a main magnetic field within the examination zone, a radio frequency transmitter unit for transmitting a radio frequency pulse in the examination zone in a transmit phase of the magnetic resonant device, a radio frequency receiver unit comprising a receiving antenna and a wireless transceiver, an energy harvesting circuit coupled to the radio frequency receiver unit, and a rechargeable power source coupled to the energy harvesting circuit for being charged by the harvested electric energy to power the radio frequency receiver unit. The receiving antenna receives magnetic resonant signals of the magnetic resonant examination in a receiver phase of the magnetic resonant device, the wireless transceiver receives the magnetic resonant signals from the receiving antenna and wirelessly transmitting the received magnetic resonant signals to a transceiver unit remote from the examination zone, and the energy harvesting circuit induces a harvesting current flowing through the receiving antenna to harvest electric energy from the receiving antenna in the transmit phase of the magnetic resonant device.

According to one embodiment of the present invention, the energy harvesting circuit further comprises a rectifier having a rectifier impedance Zrec, and an impedance matching circuit for transferring the rectifier impedance Zrec to input impedance Zin of the energy harvesting circuit. The input impedance Zin determines a level of the induced harvesting current.

According to one embodiment of the present invention, the impedance matching circuit comprises a transformer.

These and other aspects of the invention will be apparent from and elucidated with reference to the embodiments described hereinafter.

BRIEF DESCRIPTION OF THE DRAWINGS

The above and other objects and features of the present invention will become more apparent from the following detailed description considered in connection with the accompanying drawings, in which.

The same reference numerals are used to denote similar parts throughout the figures.

DETAILED DESCRIPTION OF EMBODIMENTS

Detailed description of the present invention is given below in connection with the accompanying drawings.

Figure 1:
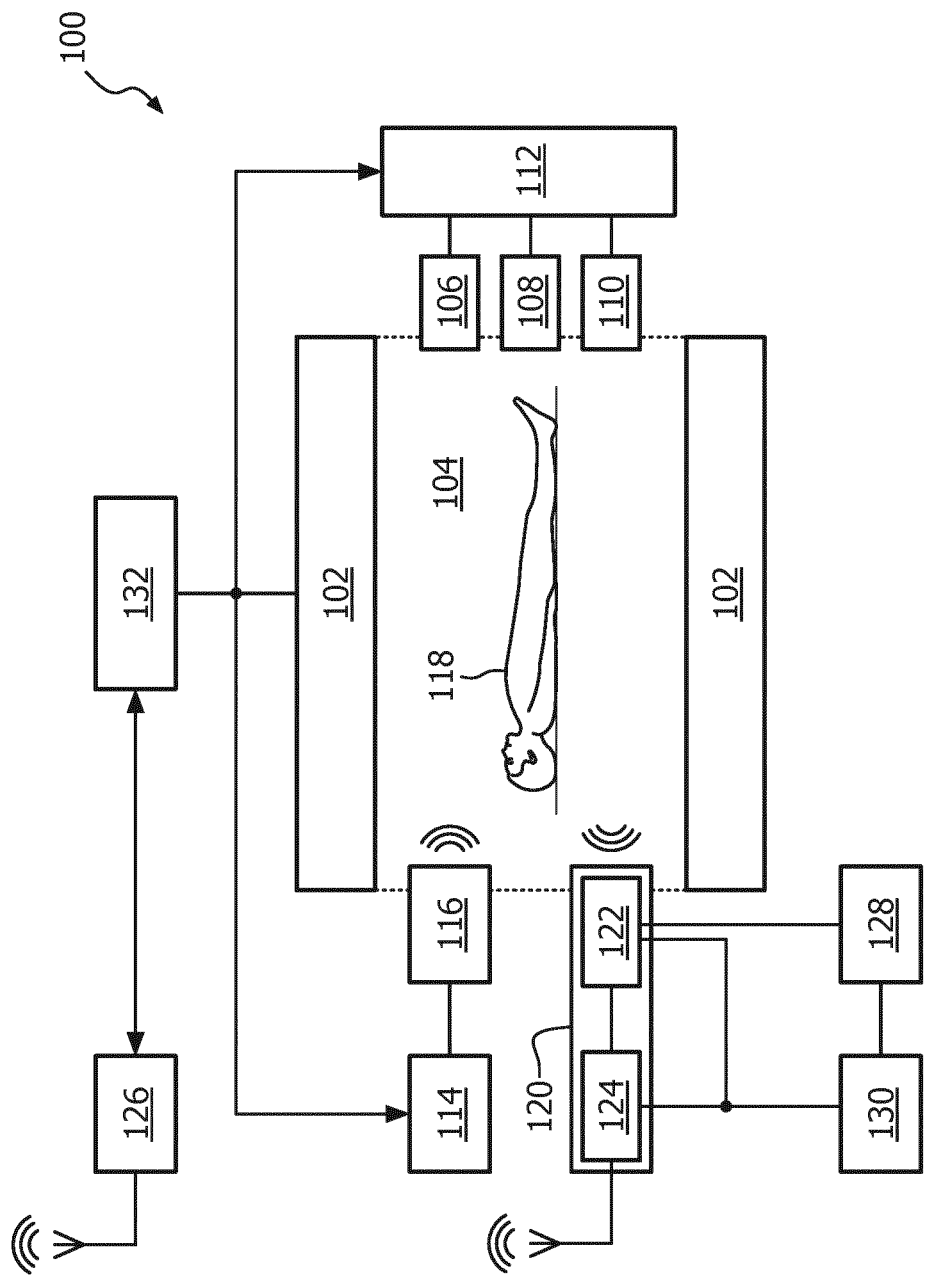
FIG. 1 illustrates a block diagram of magnetic resonant scanner 100 according to one embodiment of the present invention.

FIG. 1 illustrates a block diagram of magnetic resonant scanner 100 according to one embodiment of the present invention. The magnetic resonant scanner 100 comprises a main magnet 102 for generating a main magnetic field through an examination zone 104 and three sets of gradient coils 106, 108 and 110 for superimposing magnetic field gradients or gradient pulses across the examination region 104, typically along three orthogonal directions. The three sets of gradient coils 106, 108 and 110 are driven by a gradient amplifier 112. In one embodiment, the main magnetic 102 comprises a superconducting magnet. Alternatively, the main magnetic 102 comprises a set of main magnet coils. The magnetic resonant scanner 100 further comprises a radio frequency (RF) transmitter 114 for generating RF pulses and a RF amplifier 116 for increasing the power of the RF pulses. The RF pulses amplified by the RF amplifier 116 is transmitted to a body 118 placed in the examination zone 104. Also provided is a RF receiver 120 which comprises a receiving coil unit 122 and a wireless transceiver 124. The receiving coil unit 122 receives magnetic resonant signals from the examination zone 104. The received magnetic resonant signals are transformed into digital signals and wirelessly transmitted to a transceiver unit 126 remote from the examination zone by the wireless transceiver 124. To provide electric power for the RF receiver 120, the magnetic resonant scanner 100 further comprises an energy harvesting circuit 128 and a rechargeable power source 130. The energy harvesting circuit 128 is coupled to the receiving coil unit 122 to harvest electric power from the receiving coil unit 122. The rechargeable power source 130, such as a rechargeable battery or a capacitor, is charged by the harvested electric power to power the receiving coil unit 122 and the wireless transceiver 124 in the RF receiver 120.

To implement a selected magnetic resonance sequence of a magnetic resonant examination, the magnetic resonant scanner 100 further comprises a system controller 132 for providing appropriate control signals. More specifically, the control signals control a sequence of the RF pulses generated by the RF transmitter 114, strength of the gradient pulses driven by the gradient amplifier 112, and an operation phase of the magnetic resonant scanner 100. In a transmit phase of the magnetic resonant scanner 100, the RF transmitter 114 is instructed to transmit RF pulses into the examination zone 104 and the RF receiver 120 is detuned. The energy harvesting circuit 128 induces a harvesting current flowing through the receiving coil unit 122 to harvest electric power from the RF receiver 120 in the transmit phase of the magnetic resonant scanner 100. The harvested electric power is stored in the rechargeable power source 130 for continuously powering the RF receiver 120. In a receiver phase of the magnetic resonant scanner 100, the RF transmitter 114 is instructed to stop RF pulses transmission into the examination zone 104 and the RF receiver 120 is tuned to receive magnetic resonant signals of the magnetic resonant examination.

With reference to the embodiment of FIG. 1, to determine the operation phase of the magnetic resonant scanner 100, the control system 132 asserts a tune-detune control signal to the transceiver unit 126, which further communicates the tune-detune control signal wirelessly to the wireless transceiver 124 in the RF receiver 120. Upon reception of the tune-detune control signal, the receiving coil unit 122 is tuned to a resonant mode for magnetic resonant signal detection or detuned to a non-resonant mode for energy harvesting accordingly. Alternatively, the control signals asserted by the system controller 132 are transmitted by wire (not shown). For example, the system controller 132 is coupled to the receiving coil unit 122 in the RF receiver 120 by wire to communicate the tune-detune control signal.

Advantageously, by harvesting energy from the RF receiver 120 during the transmit phase of the magnetic resonant scanner 100 and powering the RF receiver 120 throughout the magnetic resonant examination, traditional cumbersome and expensive DC cablings can be eliminated from the magnetic resonant scanner 100.

Figure 2:
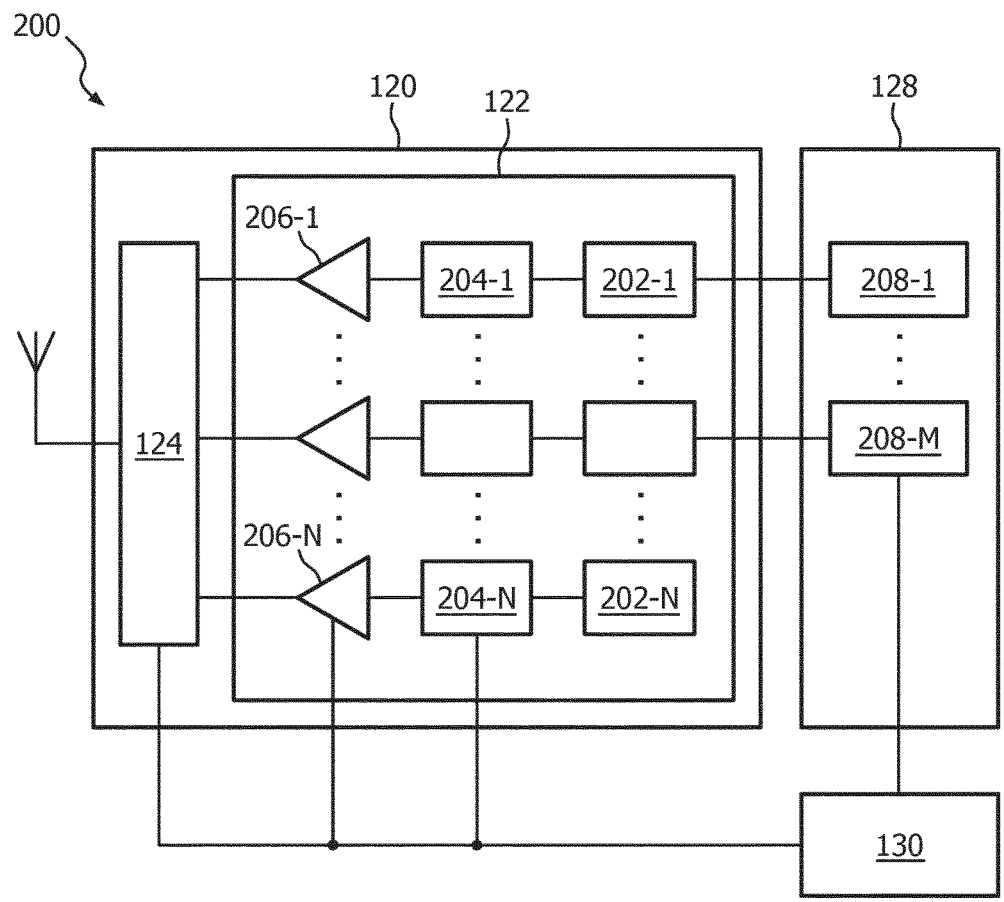
FIG. 2 illustrates a block diagram of an energy harvesting arrangement 200 for the magnetic resonant scanner 100 according to one embodiment of the present invention.

FIG. 2 illustrates a block diagram of an energy harvesting arrangement 200 for the magnetic resonant scanner 100 according to one embodiment of the present invention. In the embodiment of FIG. 2, the receiving coil assembly 122 further comprises one or more receiving antennas 202-1 through 202-N, one or more detune circuits 204-1 through 204-N, and one or more preamplifiers 206-1 through 206-N to formulate N receiving channels, wherein N is an integer equal to or greater than 1. Also provided is the energy harvesting circuit 128 comprising M energy harvesting units 208-1 through 208-M, where M is an integer equal to or less than N. Each energy harvesting unit is coupled to a corresponding receiving channel to harvest electric power.

Taking one of the N receiving channels including the receiving antenna 202-1, detune circuit 204-1 and preamplifier 206-1 as an example, in the receiver phase of the magnetic resonant scanner 100, the receiving antenna 202-1 is tuned by the detune circuit 204-1 to receive magnetic resonant signals of the magnetic resonant examination, and the received magnetic resonant signals are further amplified by the preamplifier 206-1 before being sent to the wireless transceiver 124. In the transmit phase of the magnetic resonant scanner 100, the receiving antenna 202-1 is detuned by the detune circuit 204-1. In this instance, the corresponding energy harvesting unit 208-1 will induce an energy harvesting current flowing through the receiving antenna 202-1 to harvest desired electric power. In a similar fashion, the other receiving channels are tuned to receive magnetic resonant signals of the magnetic resonant examination in the receiver phase of magnetic resonant scanner 100, and are detuned to provide electric power if corresponding energy harvesting units are coupled thereto. It is noted that the number M of the energy harvesting units is determined by the minimum electric power demand for continuously powering the RF receiver 120 throughout the magnetic resonant examination. With more energy harvesting units, more electric power can be harvested from the RF receiver unit 120 operating in the transmit phase of the magnetic resonant scanner 100 to meet the electric power demand. The energy harvesting units 208-1 through 208-M are further coupled in series to charge the rechargeable power source 130. As such, the rechargeable power source 130 can provide stable DC power to energize one or more components in the RF receiver 120, such as the wireless transceiver 124, the preamplifiers 206-1 through 206-N and the detune circuits 204-1 through 204-N.

In the embodiment of FIG. 2, each receiving channel comprises an individual preamplifier. Alternatively, the multiple receiving channels can share a common preamplifier to reduce system cost. Similarly, the transceiver unit 124 can be shared by the multiple receiving channels as illustrated in FIG. 2. Alternatively, multiple transceiver units can be adopted, each of which is coupled to a corresponding receiving channel. It should be recognized by the skilled in the art that the energy harvesting arrangement 200 for the magnetic resonant scanner 100 can have various configurations adapted to various system design considerations, such as lower cost, simplified complexity, etc. It is intended that the invention be construed as including all such modifications and alternations insofar as they come within the scope of the appended claims or the equivalents thereof.

Figure 3:
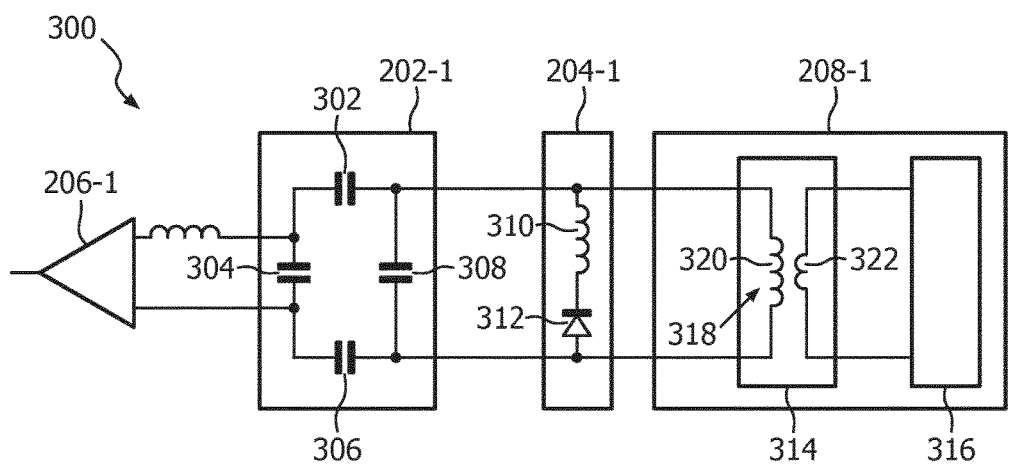
FIG. 3 illustrates a schematic diagram of an energy harvesting arrangement 300 for a receiving channel according to one embodiment of the present invention.

FIG. 3 illustrates a schematic diagram of an energy harvesting arrangement 300 for a receiving channel according to one embodiment of the present invention. With reference to FIG. 2 and FIG. 3, the energy harvesting arrangement 300 comprises the preamplifier 206-1, the receiving antenna 202-1, the detune circuit 204-1, and the energy harvesting unit 208-1. In the embodiment of FIG. 3, the receiving antenna 202-1 comprises four capacitors 302, 304, 306 and 308, the detune circuit 204-1 comprises an inductor 310 and a diode 312 coupled in series, and the energy harvesting circuit 208-1 comprises an impedance matching circuit 314 and a rectifier 316. The detune circuit 204-1 is coupled in parallel with a capacitor in the receiving antenna loop, e.g., the capacitor 308 as shown in FIG. 3. The impedance matching circuit 314 is coupled in parallel with the detune circuit 204-1.

As mentioned with reference to FIG. 2, in the transmit phase of the magnetic resonant scanner 100, the receiving antenna 202-1 is detuned by the detune circuit 204-1. To the end, the diode 312 is switched on such that the inductor 310 will resonant together with the capacitor 308 in a parallel-resonant manner to form an open circuit, which therefore detunes the receiving antenna 202-1 by blocking current through it. With the introduction of the energy harvesting unit 208-1, an induced current is allowed to flow through the receiving antenna 202-1 and electric power from the receiving antenna 202-1 is outputted through the impedance matching circuit 314. The level of the induced harvesting current is carefully selected to achieve an acceptable maximum level which ensures enough electric power is harvested to energize the RF receiver 120 and at the same time keeps the receiving antenna 202-1 in the non-resonant state to avoid any damage to circuit components and bring negligible inference on image quality. The level of the induced harvesting current is determined by input impedance Zin of the energy harvesting unit 208-1, which is comparable to an open circuit. In the embodiment of FIG. 3, the impedance matching circuit 314 is realized by a transformer 318, so the input impedance of the energy harvesting unit 208-1 in FIG. 3 is given by equation (1), $$Z_{in} = n^2 * Z_{rec} \quad (1),$$

where n represents a tuning ratio between a primary winding 320 and a secondary winding 322 of the transformer 318, and Zrec represents a dynamic input impedance of the rectifier 316. Seen from equation (1), the transformer 318 transforms the input impedance Zrec to appropriate input impedance Zin to achieve a balance between image quality of the magnetic resonant examination and the amount of harvested electric power. In other words, the level of the induced harvesting current can be decreased by increasing the input impedance Zin of the energy harvesting circuit to improve an image quality of the magnetic resonant examination, and the level of the induced harvesting current can be increased by decreasing the input impedance Zin of the energy harvesting circuit to increase the harvested electric power. In the embodiment of FIG. 3, the appropriate input impedance Zin is achieved by carefully selecting the turning ratio n of the transformer 318.

In the embodiment of FIG. 3, the detune circuit 204-1 is exemplarily designed as including a serially coupled inductor 310 and diode 312. It should be recognized by the skilled in the art that the detune circuit 208-1 can have various configurations as long as the basic function of detuning or tuning the receiving antenna 202-1 to switch it between the non-resonant mode and resonant mode can be achieved. Various other configurations of the detuned circuit 208-1 will be not described herein for the purposes of clarity and concise.

Figure 4:
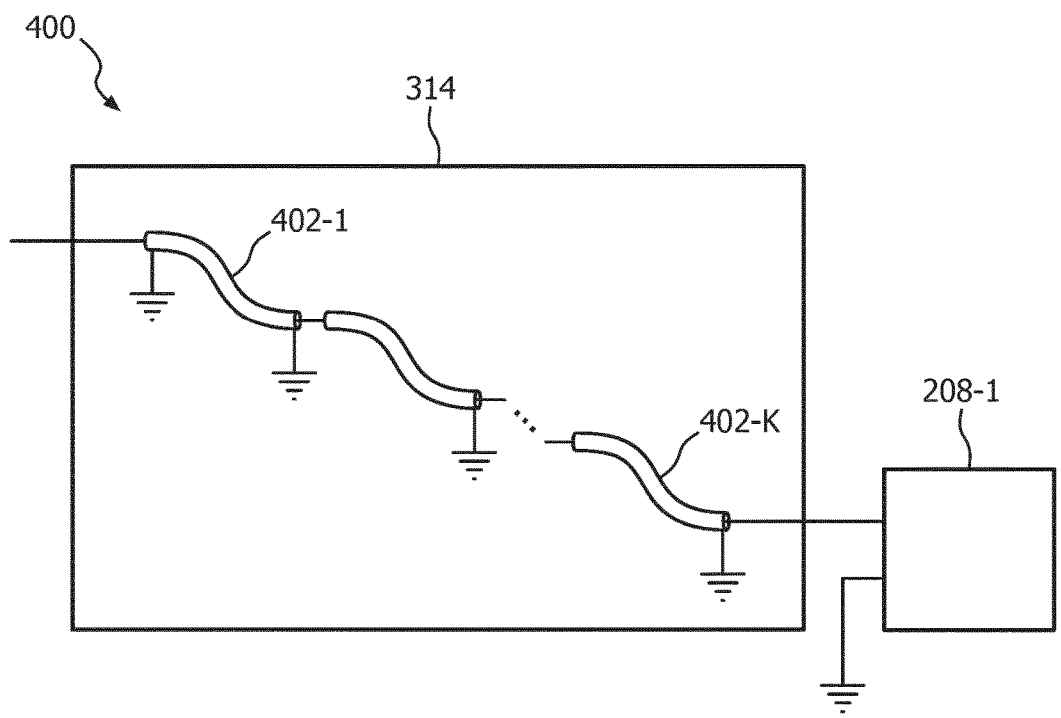
FIG. 4 illustrates a schematic diagram of an energy harvesting arrangement 400 for a receiving channel according to another embodiment of the present invention.

FIG. 4 illustrates a schematic diagram of an energy harvesting arrangement 400 for a receiving channel according to another embodiment of the present invention. As illustrated in FIG. 4, the impedance matching circuit 314 is realized by multi-stage quarter-wavelength transmission lines 402-1 through 402-K, where K is an integer equal to or greater than 1. When K is an odd integer, the input impedance of the energy harvesting unit 208-1 in FIG. 4 is given by equation (2), $$Z_{in} = (Zc_k^2 * Zc_{k-2}^2 * \ldots * Zc_3^2 * Zc_1^2) / (Zc_{k-1}^2 * Zc_{k-3}^2 * \ldots * Zc_2^2 * Z_{rec}) \quad (2),$$

where Zc1 through Zck represents characteristic impedance of corresponding transmission lines 402-1 through 402-K.

When K is an even integer, the input impedance of the energy harvesting unit 208-1 in FIG. 4 is given by equation (3), $$Z_{in} = (Zc_k^2 * Zc_{k-2}^2 * \ldots * Zc_4^2 * Zc_2^2 * Z_{rec}) / (Zc_{k-1}^2 * Zc_{k-3}^2 * \ldots * Zc_3^2 * Zc_1^2) \quad (3).$$

Figure 5:
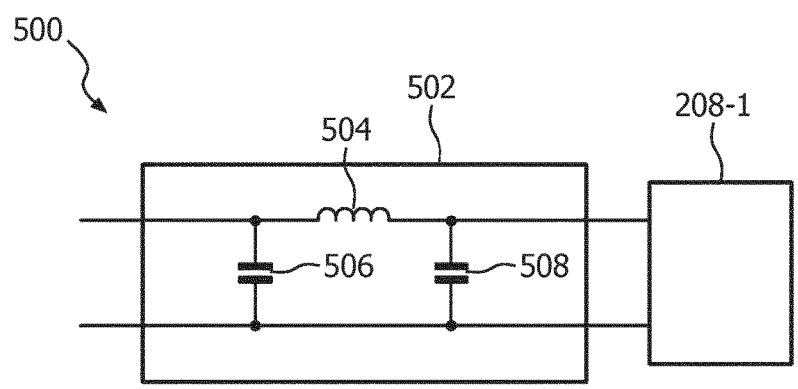
FIG. 5 illustrates a schematic diagram of an energy harvesting arrangement 500 for a receiving channel according to yet another embodiment of the present invention.

FIG. 5 illustrates a schematic diagram of an energy harvesting arrangement 500 for a receiving channel according to yet another embodiment of the present invention. As illustrated in FIG. 5, the impedance matching circuit 314 is realized by a discrete component transformer network 502 including an inductor 504 and capacitors 506 and 508. The discrete component transformer network 502 is an equivalent circuit of a quarter-wavelength transmission line with length θ and characteristic impedance Z, as long as the following equations (4) and (5) are satisfied.

$$L = Z \frac{\sin\theta}{\omega} \quad (4)$$

$$C = \frac{1}{Z\omega} \cdot \frac{1 - \cos\theta}{\sin\theta} \quad (5)$$

Where L is inductance of the inductor 504, C is the capacitance of the capacitors 506 and 508, ω is an angular frequency of the working frequency. For a magnet resant application, ω is close to the Larmor frequency of patient 104.

Figure 6:
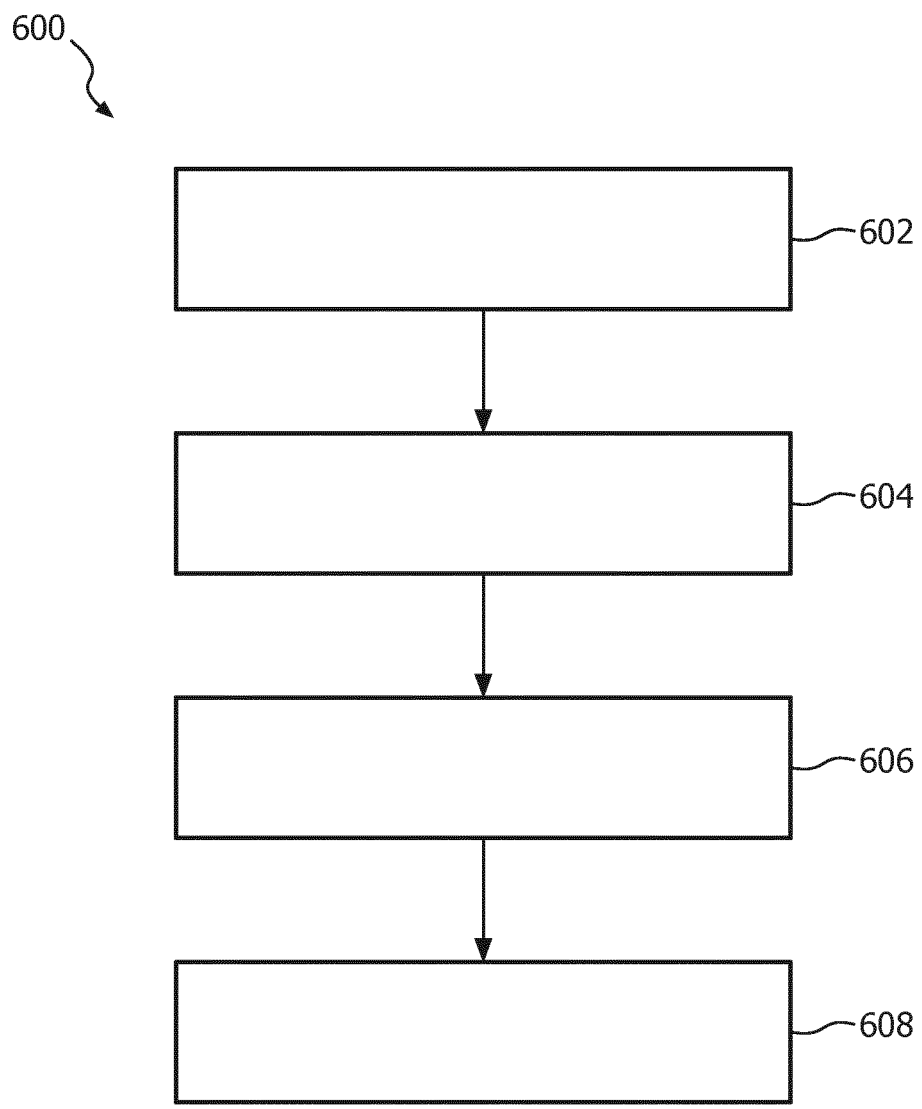
FIG. 6 illustrates a flow chart 600 of a method for harvesting energy according to one embodiment of the present invention.

FIG. 6 is a flow chart 600 of a method for harvesting energy according to one embodiment of the present invention. FIG. 6 is described in combination with FIG. 1 through FIG. 3. At step 602, a receiving antenna is switched between a resonant mode and a non-resonant mode. As illustrated with reference to FIG. 2, the receiving antenna 202-1 is switched to the non-resonant mode in the transmit phase of the magnetic resonant scanner 100 and to the resonant mode in the receiver phase of the magnetic resonant scanner 100. At step 604, the receiving antenna 202-1 in the resonant mode receives a magnetic resonant signal of the magnetic resonant examination. At step 606, the energy harvest circuit 208-1 induces a harvesting current flowing through the receiving antenna 202-1 in the non-resonant mode. At step 608, electric power from the receiving antenna 202-1 through which the harvesting current flows is harvested.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The disclosed method can be implemented by means of hardware comprising several distinct elements, and by means of a suitably programmed computer. In the system claims enumerating several means, several of these means can be embodied by one and the same item of computer readable software or hardware. The mere fact that certain measures are recited in mutually different dependent claims does not indicate that a combination of these measures cannot be used to advantage.

The invention claimed is:

1. A magnetic resonant scanner comprising:
   a receiving antenna;
   a detune circuit coupled to the receiving antenna for switching the receiving antenna between a resonant mode and a non-resonant mode, the receiving antenna in the resonant mode receiving a magnetic resonant signal of a magnetic resonant examination;
   an energy harvesting circuit electrically coupled in parallel with the detune circuit for inducing a harvesting current flowing through the receiving antenna in the non-resonant mode and for harvesting electric energy from the receiving antenna, wherein the harvesting current is determined based upon an input impedance ($Z_{in}$) of the energy harvesting circuit.

2. The magnetic resonant scanner of claim 1, wherein the energy harvesting circuit further comprises:
   a rectifier having a rectifier impedance ($Z_{rec}$); and
   an impedance matching circuit for transferring the rectifier impedance ($Z_{rec}$) to the input impedance ($Z_{in}$) of the energy harvesting circuit.

3. The magnetic resonant scanner of claim 2, wherein the impedance matching circuit is a transformer.

4. The magnetic resonant scanner of claim 2, wherein the impedance matching circuit is K stage transmission lines.

5. The magnetic resonant scanner of claim 2, wherein the impedance matching circuit is a discrete component transformer network including an inductor and a capacitor.

6. The magnetic resonant scanner of claim 1, further comprising:
   a rechargeable power source coupled to the energy harvesting circuit for being charged by the harvested electric energy.

7. A coil assembly for a magnetic resonance scanner comprising:
   an antenna configured to receive magnetic resonance signals, the antenna including a first capacitor;
   a detune circuit coupled in parallel with the first capacitor for switching the antenna between a resonant mode and a non-resonant mode, the detune circuit being configured to switch an inductor in connection with the first capacitor in a parallel resonant manner to form an open circuit in the non-resonant mode;
   an energy harvesting circuit electrically coupled in parallel with the detune circuit and configured to induce a harvesting current flow through the antenna in the non-resonant mode and to harvest electric energy from the antenna, wherein the harvesting current is determined based upon an input impedance ($Z_{in}$) of the energy harvesting circuit.

8. An energy harvesting method for a magnetic resonant scanner performing an magnetic resonant examination, the energy harvesting method comprising:
   switching a receiving antenna between a resonant mode and a non-resonant mode by a detune circuit;
   receiving a magnetic resonant signal of a magnetic resonant examination by the receiving antenna in the resonant mode;
   inducing a harvesting current flowing through the receiving antenna in the non-resonant mode by an energy harvest circuit electrically coupled in parallel with the detune circuit, wherein the harvesting current is determined based upon an input impedance ($Z_{in}$) of the energy harvesting circuit and
   harvesting electric energy from the receiving antenna through which the harvesting current flows.

9. The energy harvesting method of claim 8, further comprising:
   rectifying the harvested electric energy by a rectifier having a rectifier impedance ($Z_{rec}$); and
   transferring the rectifier impedance ($Z_{rec}$) to the input impedance ($Z_{in}$) of the energy harvesting circuit.

10. The energy harvesting method of claim 8, further comprising:
    charging a rechargeable power source with the harvested electric energy.

11. The magnetic resonant scanner of claim 1, further comprising:
    a main magnet for generating a main magnetic field within an examination zone of the magnetic resonant examination;
    a radio frequency transmitter unit for transmitting a radio frequency pulse in the examination zone in a transmit phase of the magnetic resonant scanner; and
    a radio frequency receiver unit comprising the receiving antenna and a wireless transceiver to be powered by the harvested electric energy, the wireless transceiver receiving the magnetic resonant signal from the receiving antenna and wirelessly transmitting the received magnetic resonant signal to a transceiver unit remote from the examination zone in a receiver phase of the magnetic resonant scanner.

12. The magnetic resonant scanner of claim 1, wherein an image quality of the magnetic resonance examination and an amount of the harvested electric energy is adjustable by adjusting the input impedance of the energy harvesting circuit.

13. The energy harvesting method of claim 8 further comprising:
    adjusting a level of the harvesting current to improve an image quality of the magnetic resonance examination by adjusting the input impedance ($Z_{in}$).

14. The energy harvesting method of claim 8, wherein the receiving antenna includes a first capacitor and the detune circuit includes an inductor and wherein inducing the harvesting current includes:
    switching the inductor and the first capacitor into a parallel resonant relationship to form an open circuit.

15. The energy harvesting method of claim 8, further including:
    adjusting the input impedance of the energy harvesting circuit to adjust a magnitude of the energy harvesting current.

16. The energy harvesting method of claim 8, wherein the receiving antenna is connected with an amplifier and a transceiver to amplify and convey the received magnetic resonant signal in the resonant mode and further including:
    powering the amplifier and the transceiver with the harvested electric energy.

* * * * *